United States Patent [19]

Smallcombe et al.

[11] 4,070,708
[45] Jan. 24, 1978

[54] ANALYTICAL INSTRUMENT OPTIMUM DATA ACQUISITION METHOD AND APPARATUS

[75] Inventors: Stephen H. Smallcombe; Howard D. W. Hill, both of Cupertino, Calif.

[73] Assignee: Varian Associates, Inc., Palo Alto, Calif.

[21] Appl. No.: 719,557

[22] Filed: Sept. 1, 1976

[51] Int. Cl.² .............................................. G06F 15/34
[52] U.S. Cl. .................................... 364/575; 364/574; 364/498; 364/300; 324/.5 A
[58] Field of Search ................ 324/.5 R, .5 A, .5 AH; 235/151.3, 151.32, 151.35; 73/517

[56] References Cited

U.S. PATENT DOCUMENTS

| | | | |
|---|---|---|---|
| 3,581,191 | 5/1971 | Anderson | 235/151.35 X |
| 3,622,765 | 11/1971 | Anderson | 235/151 S |
| 3,720,816 | 3/1973 | Keller et al. | 235/151.35 |
| 3,763,362 | 10/1973 | Griem, Jr. | 235/151.31 |

OTHER PUBLICATIONS

Fourier Difference Spectroscopy, Richard R. Ernst; Journal of Magnetic Resonance, vol. 4, No. 2, Apr. 1971, pp. 280–296.

Primary Examiner—Edward J. Wise
Attorney, Agent, or Firm—Stanley Z. Cole; Gerald M. Fisher

[57] ABSTRACT

An analytical instrument employing ensemble averaging to improve the signal-to-noise ratio including means for determining the most efficient scaling factor and for controlling the instrument to maintain assurance of efficient averaging.

18 Claims, 8 Drawing Figures

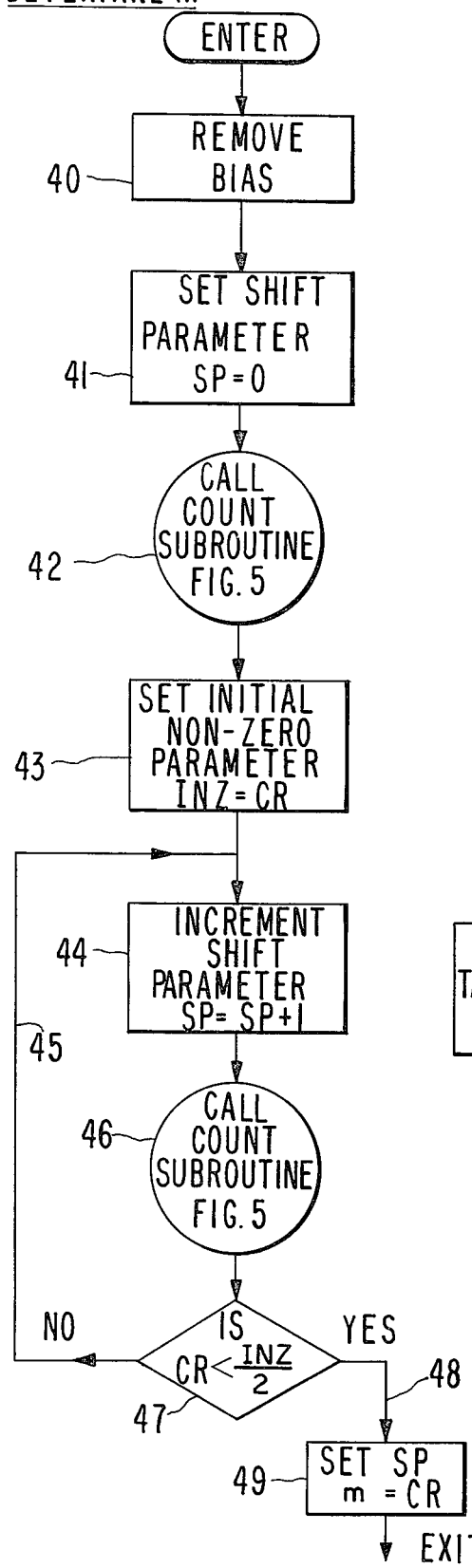
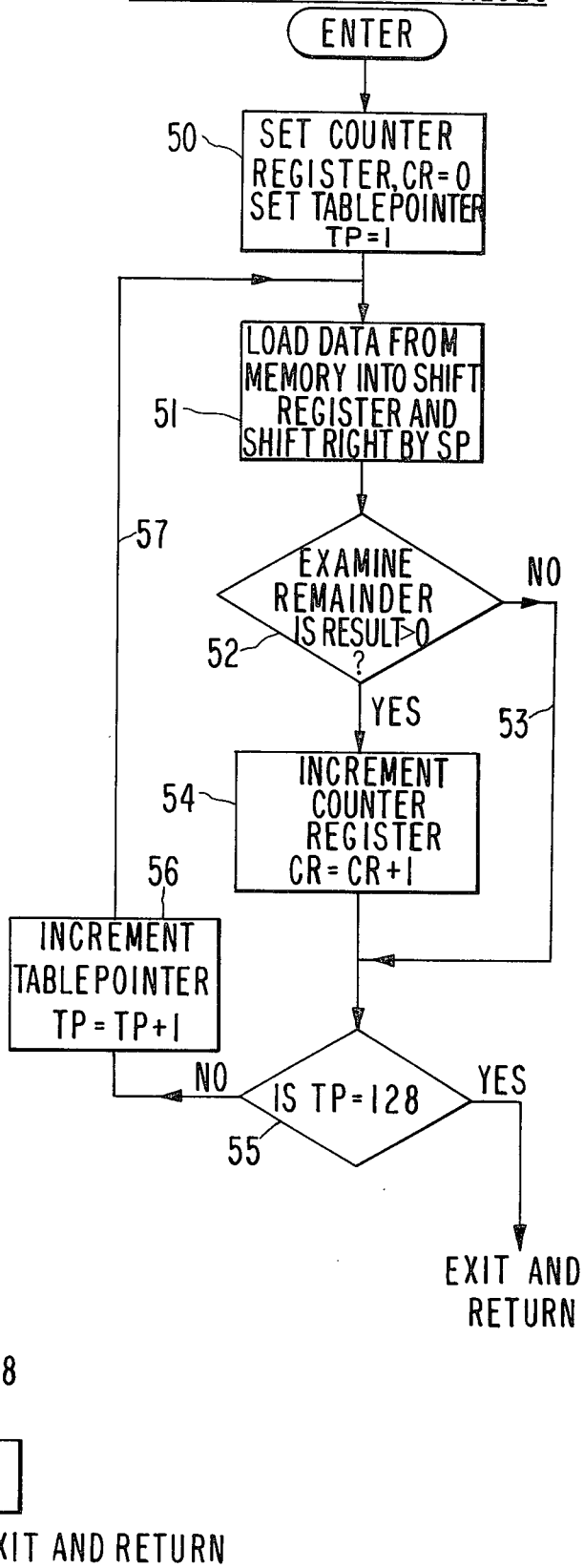

ANALYTICAL INSTRUMENT OPTIMUM DATA ACQUISITION METHOD AND APPARATUS

BACKGROUND OF THE INVENTION

Because of the dynamic range of the signals which must be accurately displayed in analytical spectrometers, large computer memories of 20 bits per channel are not uncommon. In ensemble averaging computers, a process of scaling the data in the memory channels and the incoming data has been utilized in that it permits the use of smaller memory channels. By this process, whenever it became apparent that further accumulation would produce overflow in the memory channel, the data in the channel is scaled, for example, divided by two, and the input data from subsequent scans is also divided by two before being added to memory. This scaling process permits continued accumulation with a memory having a lesser number of bits but it implies that the lower value bits from the analogue to digital converter are not being accumulated. Prior art spectrometers which employ scaling operations, did not recognize that unlimited accumulation of data did not necessarily improve the signal-to-noise ratio. In fact, under certain conditions, continued accumulation leads to a deterioration in the signal-to-noise ratio.

DESCRIPTION OF THE PRIOR ART

Some analytical instruments, and in particular, spectrometers, have employed a time averaging computer for ensemble averaging repetitive output signals over many scans in order to provide an improved signal-to-noise ratio. Under proper conditions, accumulation of data can permit recovery of signals 1000 times smaller than the noise. Such a spectrometer, in the context of an NMR impulse spectrometer is disclosed in U.S. Pat. No. 3,475,680 assigned to the same assignee as the present invention. The inclusion of a computer in an analytical instrument to derive corrections for optimizing or improving the spectrometer output is also known, such a spectrometer in the context of an NMR spectrometer is disclosed in U.S. Pat. No. 3,873,909, assigned to the assignee of the present invention. The use of an analog to digital converter to digitize the analytical instrument output signal prior to accumulation in a memory device and the data processing of the A to D converter output in order to reduce systematic digitization errors is also known, as disclosed in U.S. Pat. No. 3,622,765 assigned to the assignee of the present invention.

SUMMARY OF THE INVENTION

The principal object of the present invention is the provision of an improved analytical instrument capable of ensemble averaging of repetitive signals.

A further principal object is to provide improved analogue to digital converter methods and apparatus assuring optimum ensemble averaging within the limitations imposed by the computer memory.

A further object is to provide analytical instrument methods and apparatus which enable the use of scaling in an ensemble averager and where the analytical instrument will be automatically controlled to preclude any degradation of the signal-to-noise ratio.

A further object is to provide an optimized ensemble averager employing an A to D converter having means to measure input noise level, determine maximum scaling factors, and initiate commands to control operations of the ensemble averager and/or external instruments.

BRIEF DESCRIPTION OF THE DRAWINGS

FIG. 4 is a subroutine of FIG. 3 to determine parameter m.

FIG. 5 is a subroutine of FIG. 4 to count positive non-zero values.

DESCRIPTION OF THE PREFERRED EMBODIMENTS

Figure 1:
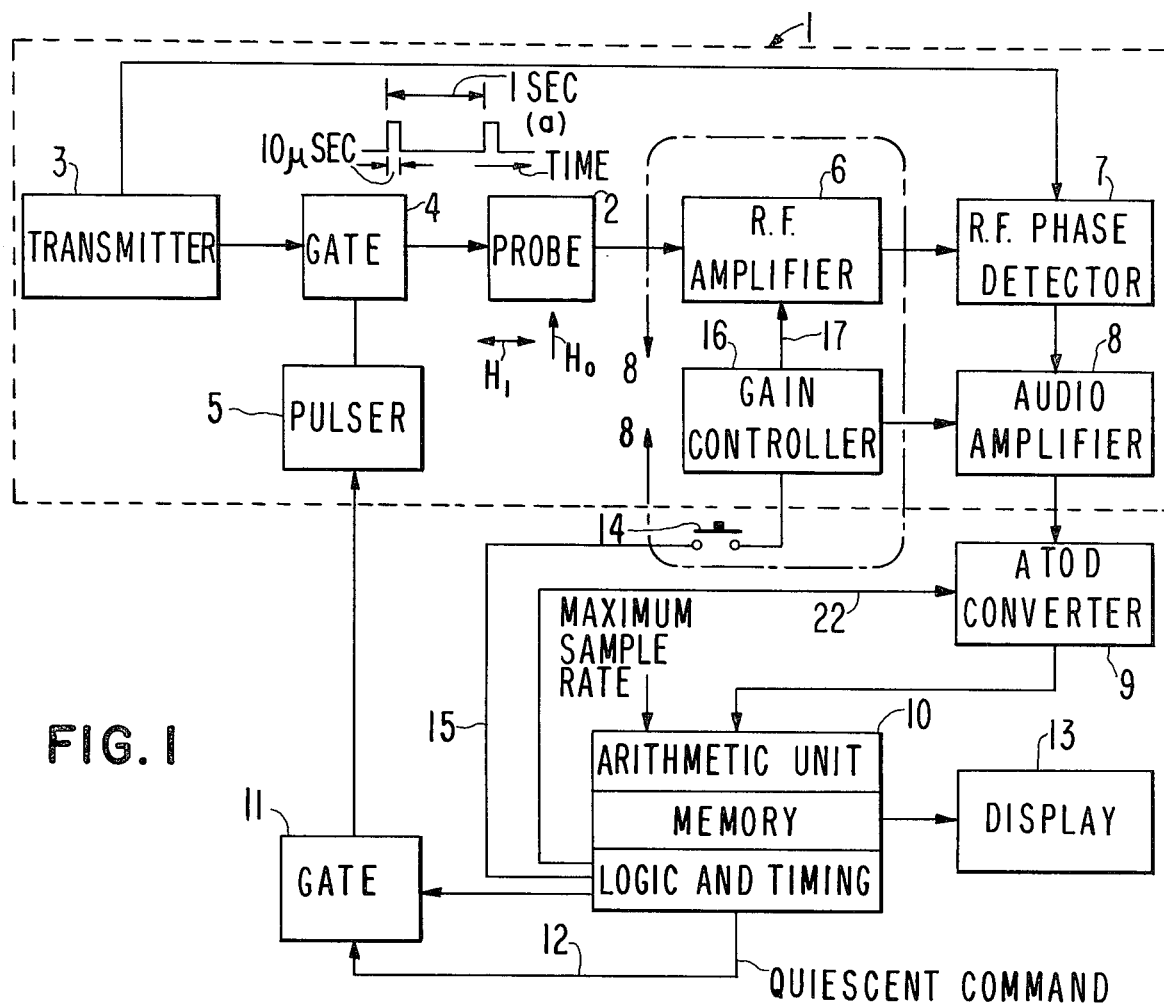
FIG. 1 is a block diagram of an Analytical NMR instrument having optimum ensemble averaging.

With reference to FIG. 1, there is shown the inventive analytical instrument including a gyromagnetic spectrometer employing ensemble averaging. Briefly, the spectrometer 1, including a probe 2 disposed in a polarizing magnetic field H for immersing a sample of matter to be investigated. An rf transmitter 3 supplying radio frequency excitation as like 100 MHz is fed to gate 4 which supplies short rf pulses as of 10 microseconds when the gate is energized by pulser 5. The bursts of rf pulses are supplied to probe 2 and to the sample for exciting impulse gyromagnetic spectral lines simultaneously from the sample.

The composite resonant signal emanating from the sample is picked up by a receiver coil in the probe 2 and fed to a radio frequency amplifier 6 wherein it is amplified and then fed to one input of a radio frequency phase detector 7 for detection against a reference sample of the transmitter frequency, thereby producing an audio frequency composite resonant signal. The composite audio frequency resonant signal is fed to an audio frequency amplifier 8 and thence to the analog-to-digital converter 9 for time scanning the resonance signal envelope under control of the logic and timing unit from the ensemble averaging computer 10. The logic and timing from the computer causes the A to D converter to sample the audio amplifier output between the pulses of rf energy provided to the probe and the samples are synchronized to such pulses.

In accordance with this invention, at the start of any experiment, automatically or under operator control, a quiescent command on line 12 is sent to gate 11 to inhibit the timing pulses from initiating operation of the pulser 5. Except for the inhibition of the timing pulses, the spectrometer 1 is otherwise activated in the same manner as during the operation wherein resonance signals of a sample are being excited, detected, sampled and stored. At the same time that the quiescent command is disabling the pulser 5, the A to D converter is caused to sample the noise at the output of the audio amplifier and transmit said sampled information to the memory in unit 10. The sampling rate of the A to D converter during this noise sampling procedure is set to the same sampling rate or lower than that sampling rate which is to be used in the experiment to follow. Proper selection of sample rate by the operator is important so that the frequencies contributing to the noise measurement are the same frequencies of noise which will contribute to the noise during the experiment. As soon as an appropriate number of samples of the noise have been stored, as of 128 points, either from a single measurement or ensemble averaged measurements, with or without sign changes for bias removal, the computer is caused to determine the maximum permissible scaling factor. When the maximum permissible scaling factor has been calculated, either automatically or by control of the operator, the experiment can be commenced by the removal of the inhibiting quiescent command to gate 11, thence starting the ensemble averaging process on the excited resonance signals of the material to be investigated.

This embodiment of the invention is envisioned primarily as an improvement to analytical instruments employing progressive scaling ensemble averaging. In progressive scaling, instead of simply adding synchronously trace by trace, into the memory until the memory is filled, traces are added into memory until the memory is likely to fill on the next trace, and then the value in the storage is divided by some factor and the next trace to be added to that memory channel is divided by the product of this factor and all previous scale factors before it is added to the storage. This process is called progressive scaling. We have provided an improved method and apparatus for determining when further scaling operations in a progressive scaling ensemble averager will deteriorate the final signal-to-noise ratio. This objective is accomplished by measuring the noise level prior to experiment of the analytical instrument in the same or equivalent state as during the experiment, but in the absence of signal and by controlling the analytical instrument to discontinue accumulations when the scaling factor would cause, during accumulation, the scaled rms noise value $V'$ to become smaller than approximately 1 bit of the memory channel 9. Hence, during the accumulation process of the experiment, the computer repeatedly makes a comparison between the number of scaling operations performed and the previously determined maximum permissible number of scaling operations. When it is determined that the scaling factor has become greater than a permissible scaling factor, a command is given to discontinue further accumulation of data. Alternatively, this comparative test could cause an indication which would be sensible by an operator to warn him that further accumulation could result in deterioration of the signal-to-noise ratio.

An alternative to progressive scaling ensemble averaging is to use a constant scaling factor, equal to or less than the maximum permissible scaling factor, to divide all incoming data. This is called non-progressive scaling.

It can be shown that the signal-to-noise ratio of the time averaged stored data will not deteriorate significantly if the rms noise voltage ($V'$) at the data input to the A to D converter is comparable to the analogue voltage, $d$, corresponding to 1 digitized bit of the A to D converter.

Alternatively, rather than employing scaling to insure the appropriate ratio between $V'/d$, the computer can issue commands via conductor 15 through the variable gain mode switch 14, when switch 14 is closed, to the gain controller 16. When the instrument is to employ scaling, either progressive or nonprogressive, the variable gain mode switch 14 is in its open state, and the gain of the amplifiers are maintained at a constant level independent of the ratio $V'/d$. In the variable gain mode, gain controller 16, such as a bank of selector relays, is operated to select appropriate resistors for modifying the feedback resistors in amplifiers 6 or amplifier 8 to control their gain and hence the rms level of the noise voltage at the input to the A/D converter. By controlling the gain so that the rms noise voltage at the input of the A/D converter is comparable to 1 digitizing bit, the most efficient ensemble averaging is assured. Gain controller 16 could also consist of a digital to analogue converter, the output voltage being fed to the amplifiers to vary their gain responsive to the computer 10.

There are a number of ways summation can be accomplished in an ensemble averager. The most straightforward method is to simply add trace upon trace until one channel of the memory is filled up at which time accumulation is stopped. There are a few disadvantages to using the above described straightforward addition method of ensemble averaging. In order to assure proper operation, the level of the input signal must be carefully selected to assure that the rms value is comparable to 1 bit. If the gain is too high, overflow may occur before the desired number of scans are achieved and if the gain is too low, even though a large number of scans are accumulated, the optimum signal to noise ratio may not be realized. The scaling technique avoids this difficulty, since it avoids the necessity for carefully selecting the amplitude of the incoming signal. However, even with scaling, unlimited improvement in the signal-to-noise ratio is not possible. Scaling which causes the rms noise level in the computer register after the scaling operation to be much less than the minimum bit value of the computer word would deteriorate the results.

Figure 2:
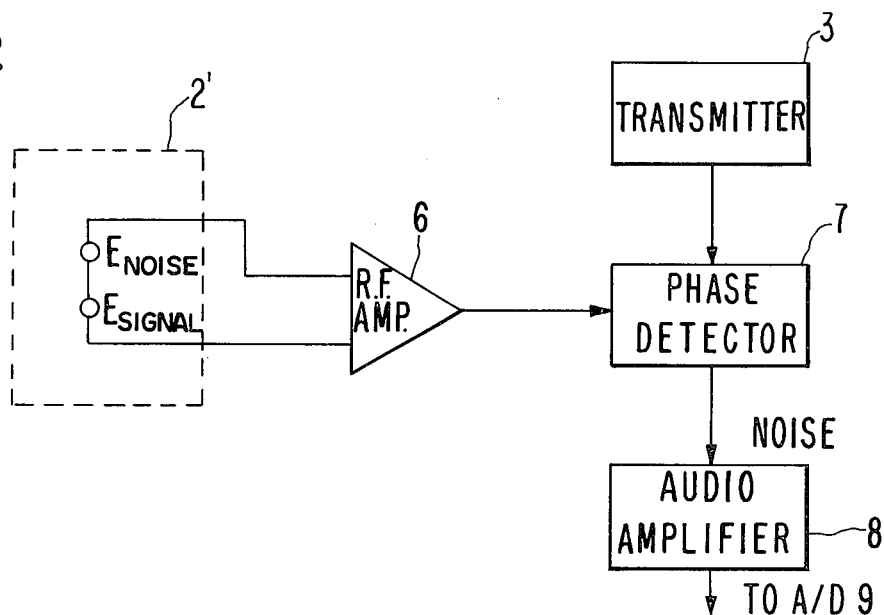
FIG. 2 is an equivalent circuit of an NMR probe and associated circuitry.

In our preferred embodiment, we have provided a technique to measure, under quiescent conditions, the noise level that will exist at the input to the A to D converter under operating conditions of the analytical instrument and to stop the analytical data accumulation when the optimum number of scaling operations has been reached. This is accomplished by placing the spectrometer in the quiescent state, i.e., all circuits energized by power and connected as in operation so that only the noise in the same frequency band as would be present during operation is available to the A to D converter input. With reference to FIG. 2, it can be seen that the probe 2' can be represented during the non-quiescent state as an equivalent noise voltage source and an equivalent signal voltage source, wherein, during the quiescent state the signal source equals zero. Since the noise voltage is primarily thermal Johnson noise, it is extremely broad band. Since the rf amplifier 6 in an NMR spectrometer is broad band, as of 0 to 1.5 Mhz, the synchronously detected output of the phase detector 7 will include all those noise frequencies which contribute to the noise output during normal operation of the spectrometer in the pulsing mode. The audio amplifier 8 may include selectable bandwidth determining elements. Preferably the amplifier 8 bandwidth is selected prior to the experiment and the same value is used during the quiescent state measurement. Hence, when the A to D converter samples the audio amplifier 8 output during the quiescent state at the selected rate, or lower, corresponding to the frequency bandwidth of the signal to be accumulated, the noise being measured is from the same noise sources and at the same intensity as during the normal pulsing operation.

In our preferred embodiment, we have chosen to measure the noise level using values of gain and bandwidth for amplifier 8 identical to those to be used in the experiment for which ensemble averaging is to be accomplished. However, since the noise level will change in a predictable manner for other values of these spectrometer parameters, it is envisioned that the ensemble averager could include a calculation step to predict the noise level at other spectrometer settings. Hence, it is not necessary that the noise measurement be accomplished at identical values of spectrometer gain and bandwidth as in an experiment.

As described below in respect to the description of the flow diagram, FIGS. 3 and 4, 128 points are sampled and set into a table in memory during the measurement of the noise with the instrument in the quiescent state preferably using the same A to D converter which will be used during normal accumulation in the pulse mode. Alternatively, a different A to D converter could be used if it had the same 1 bit value, but since an A to D converter introduces some noise of its own, the preferred method is to utilize the same A to D converter for the noise measurement as will be used during pulse mode accumulation. After setting the average value of the noise table to 0 in order to remove bias, a shifting and counting operation is carried out wherein the number of divide by 2 operations it takes to reduce the number of positive non-zero values in memory to one-half or less the number of positive non-zero values in the original unscaled table is determined.

If the amplitude distribution of independent measurements of noise voltage is represented by $f(t)$, the probability of the noise voltage falling within the range $-x$ to $x$ is $$P(x) = \int_{-x}^{x} f(t)dt \tag{1}$$

For noise with an average value of zero, i.e., from which bias has been removed, $$P(x) = 2 \int_{0}^{x} f(t)dt \tag{2}$$

If the distribution is normalized such that $$\int_{0}^{\infty} f(t)dt = \frac{1}{2},$$

a value $x$ can then be determined for which there is equal probability for a positive number to be greater than $x$ as for a positive number to be less than $x$. This value is given by $$\int_{0}^{x} f(t)dt = \frac{1}{4} \tag{3}$$

for noise of Gaussian distribution $$f(t) = \frac{1}{\sqrt{2\pi}\,\sigma} \cdot e^{\frac{-t^2}{2\sigma^2}} \tag{4}$$

Solving (3) for Gaussian noise, it can be shown that $$x = 0.68\sigma \tag{5}$$

In terms of voltages, $$\sigma = V' \tag{6}$$

by definition for a Gaussian noise distribution, and $$x = (p)(d) \tag{7}$$

where $p$ is a constant. Therefore, $$p = 0.68\ V'/d. \tag{8}$$

The determination of the number of shifting operations to reduce the number of positive non-zero values in the table by 2, using the shifting and counting scheme described, is equivalent to defining the minimum factor $m$ which satisfies the condition $$2^m \geq p \tag{9}$$

i.e.

$$2^m \geq 0.68\ V'/d. \tag{10}$$

The factor $m$ is thus equal to the number of shifting or scaling operations to reduce the number of positive non-zero values in the table to one-half or less the number of positive non-zero values in the original unscaled table.

We have preferably used the number $n = m + 1$ as a conveniently determined number representing the maximum permissible number of scaling operations. At this maximum number of scaling operations, the scaled rms noise level is in the range defined by $$0.37\ \text{LSB} < V'/2^n \leq 0.74\ \text{LSB} \tag{11}$$

where LSB is the value of the least significant bit of the storage device.

The process of digitization adds noise, but it can be shown, from the distribution function for Gaussian noise, that when $V'/2^n = 0.74$ LSB, the rms noise level in the digital data is only about 8% higher than $V'/2^n$. When $V'/2^n = 0.37$ LSB, the rms noise level in the digital data varies with the mean value of the analog signal and is, on the average, about 20% higher than $V'/2^n$. Data accumulated with the scaling in the range indicated by equation (11) therefore has a poorer signal to noise ratio than data accumulated with a smaller scaling factor. However, the signal to noise ratio is not degraded so much as to completely nullify the advantage of ensemble averaging. In the progressive scaling method, only part of the data is accumulated with this maximum scaling factor while part is accumulated with smaller scaling factors. Consequently, the signal to noise ratio in the ensemble averaged data is higher than if the total accumulation is made with the scaling factor set to the maximum value, $n$, as is done in non-progressive scaling. Thus a progressive scaling method is preferable to a non-progressive scaling method. If the gain adjustment method is used, noise generated within the A to D converter itself must be taken into account. This may typically be about $0.2d$ and represents a significant degradation of the signal to noise ratio when the gain is set to a low value to permit the maximum number of ensemble averages. Operating with higher gain and scaling following analog to digital conversion is therefore preferable since the noise from the spectrometer overrides the noise generated within the A to D converter.

The condition of equation (11) appears to be best for the maximum scaling factor to be used in the progressive scaling method of ensemble averaging. For nonprogressive scaling, the condition $$0.74 \text{ LSB} < V'/2^n \leq 1.48 \text{ LSB} \quad (12)$$

may be preferable in applications where the maximum number of accumulations is not required.

In this preferred embodiment, we elected to determine $m$ since its relation to $V'$ was known by equation (10). Other parameters, also related to $V'$, may be determined from the characteristics of the noise distribution and used to determine the suitable scaling factor to allow efficient ensemble averaging.

The procedure for determining $m$ is described below in reference to Table 1. Table 1 illustrates part of the process carried out in the computer for explanatory purposes, showing only 8 noise measurements of the preferred 128. It is assumed that bias has been removed from the table, i.e., average value of entire table is zero. Only positive numbers are shown in the table since only positive numbers are counted in the preferred counting scheme.

Column 2 of Table 1 shows the hypothetical decimal count of the instantaneous sampled value of noise as determined by an A to D converter having a minimum bit size of 1. Each entry in column 2 represents an independent measurement of noise at the input to the A to D converter and each entry is stored in a different channel. The A to D converter changes the sampled analog input to a binary number. Column 3 represents the number of binary bits it takes to represent the decimal number in column 2 for that channel, i.e., decimal 22 is represented by the 5 bit binary number 10110. Column 4 represents the number of binary bits placed in memory after all bits in memory from column 3 are divided by 2 (shifted to the right one place). Column 5 represents the number of bits placed in memory after all bits in memory from column 4 are divided by 2. Column 6 represents the number of bits placed in memory after all bits from column 5 are divided by 2 once again.

Note with respect to Table 1 that the number of non-zero bits after 3 shifting operations as shown in column 6 is equal to one-half of the number of non-zero bits in column 3. In our method, we set $m$ equal to this number of shifting operations, in this example $m = 3$. The permissable number of shifting operations, $n$, is then determined, where $n = m + 1$ or $n = 4$.

For the example of Table 1, it can be shown that $$V_{rms} = \sqrt{\frac{22^2 + 2^2 + 17^2 + 10^2 + 9^2 + 5^2 + 6^2 + 3^2}{8}} = 11.33$$

If a scaling factor of 16, equivalent to 4 scaling operations were carried out, the rms noise level of the digital data following scaling will be equal to Vrms/16. Hence, for this example, it can be seen that $V'/2^n = 0.7$ LSB which complies with the criterion of equation (11), $0.37$ LSB $< V'/2^n \leq 0.74$ LSB.

The methods of calculating the parameter $m$, and the maximum scaling operations, $n$, as described above, are the preferred methods since they involve operations which are quickly and easily carried out in a digital computer. Alternatively, $V'$ could be calculated by the straightforward method involving the square root of the sum of the squares, and the maximum permissable scaling factor could be calculated by normal division processes.

TABLE I

| Memory Channel (1) | Decimal Number (2) | Binary Bits (3) | Scale Once (4) | Scale Twice (5) | Scale Thrice (6) |
|---|---|---|---|---|---|
| 1 | 22 | 5 | 4 | 3 | 2 |
| 2 | 2 | 2 | 1 | 0 | 0 |
| 3 | 17 | 5 | 4 | 3 | 2 |
| 4 | 10 | 4 | 3 | 2 | 1 |
| 5 | 9 | 4 | 3 | 2 | 1 |
| 6 | 5 | 3 | 2 | 1 | 0 |
| 7 | 6 | 3 | 2 | 1 | 0 |
| 8 | 3 | 2 | 1 | 0 | 0 |

Figure 3:
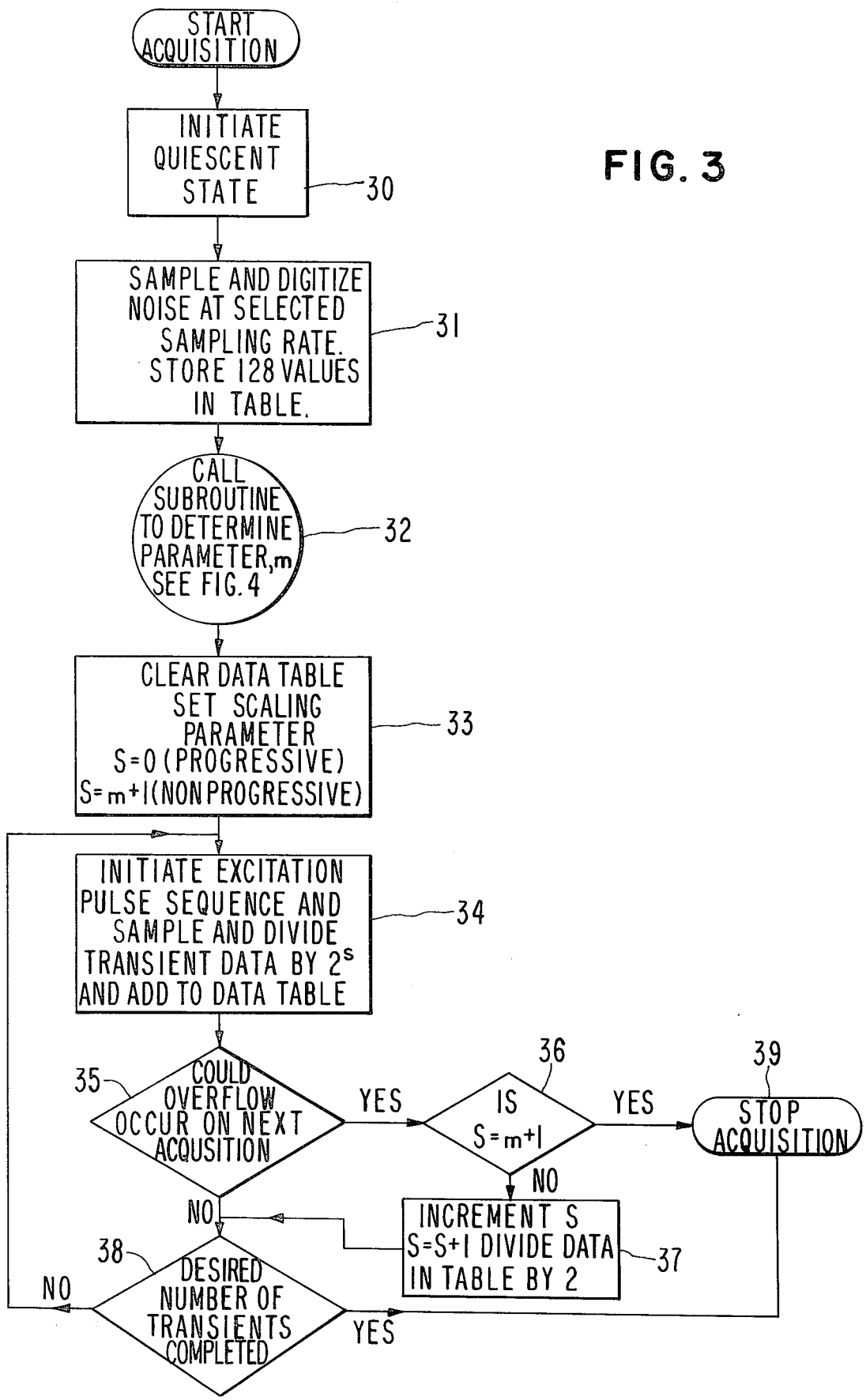
FIG. 3 is a flow diagram showing steps to optimize signal-to-noise ratio of an analytical NMR spectrometer.

FIG. 3 is a detailed flow diagram for the preferred method employed for determining the maximum permissible number of scaling operations, herein equal to $m + 1$ and for initiating the accumulation stop comman. Upon the commencement of an experiment, the logic unit issues an initiate quiescent state command 30 along conductor 12, FIG. 1 to deactivate the gate 11, and to cause the A/D converter 9 to digitize the noise at its input at a rate equal to the predetermined selected sampling rate corresponding to the proper bandwidth for frequencies of interest in the accumulation experiment to follow. We take and digitize 128 samples of noise which are placed into a table in memory. Next, after the 128 values are tabled, the parameter $m$ is determined by the subroutine of FIG. 4. The main program flow indicates this in circle 32 as a "call subroutine to determine parameter $m$". When this subroutine is completed (FIG. 4), the operations EXIT the subroutine and return to the flow diagram of FIG. 3 routine and initiate operation 33. For progressive scaling, after $m$ is determined and stored, a register, S, which stores the number of divide by two scaling operations performed during accumulation and ensemble averaging is set to zero. For nonprogressive scaling, the register S is set to $m + 1$. Progressive or nonprogressive scaling could be an operator selection, or either mode can be a selected mode of operation of the instrument. In operation 34, pulse excitation is caused to commence and the spectrometer output is sampled, divided by $2^s$ and added to memory. Block 35 depicts the step of examining each memory channel after each accumulation thereto to see if that channel would overflow if the next data value were equal to the maximum scaled A/D output. If overflow of any channel could occur, the comparison in operation 36 is performed If $S = m + 1$, acquisition of further data is terminated as shown in block 39. If $S < m + 1$, then the S register is incremented $S = S + 1$ and each memory channel is scaled by dividing the data by 2. Next, the operation 38 depicts an examination of the total number of transients accumulated to see if the desired number of accumulations have taken place. If so, the STOP ACQUISITION command is issued as shown by block 39. If the desired total number of accumulations has not yet been taken, the process at block 34 is re-instituted. This process is then repeated until the comparison in block 36 indicates that the number of scaling operations stored in register S is equal to $m + 1$, $S = m + 1$, or that the desired number of transients is completed.

The subroutine for determining the parameter $m$ is depicted in FIG. 4 and FIG. 5. With reference to FIG.

4, the first operation in the "determine $m$" subroutine is to remove any bias which may exist in the numbers in the table. This is done by finding the mean of all the stored 128 numbers and subtracting the mean from each of the numbers. Operation 41, sets a register called the "shift parameter register" to zero, and operation 42 calls the Count Subroutine of FIG. 5 for determining how many of the original 128 measurements, after bias removal, are positive non-zero numbers. Since the noise is Gaussian, after bias removal, it is presumed that there is an equally high probability that there will be an almost equal number of positive and negative values of noise. Hence, we are able to carry out our method using only the positive numbers.

With reference to FIG. 5, after setting a register called the Counter Register "CR" to zero, and the Table Pointer Register "TP" to zero, operation 51 causes each of the 128 stored noise measurements to be taken from memory, one by one and shifted right by the number of shifts stored in the Shift Parameter Register 41. For the first measurements, SP = 0, so there is no shifting. Hence the operations 52 and 54 result in a counting of the number of non-zero numbers in memory by examining to see if each number is greater than zero. For each number greater than zero, the Counter Register CR is incremented one bit, while zero and negative numbers do not increment the CR register. Operation 55 checks the total number of interrogations completed and if less than 128 causes the Table Pointer Register to increment TP to TP + 1 in operation 56 and to look at the next number in the memory and repeat the operations 51–55 until all 128 points have been interrogated, and then commands a return to the FIG. 4 subroutine. At the end of the first time the Count Subroutine is run, the Counter Register CR, represents the number of positive non-zero values of noise, after bias removal, of the original 128 measurements. This number CR is stored, operation 43 as the Initial Non-zero Parameter "INZ". Operation 44, causes the Shift Parameter Register to be incremented by one, SP = SP + 1, and the Count Routine (FIG. 5) is called again in operation 46. As before, upon entry into the Count Subroutine, operation 50 resets CR and TP to zero and starts loading the data from memory in a shift register, but this time the Shift Parameter equals 1, so each word is shifted to the right one bit and the operations 53 and 54 are repeated for each word, for all the 128 words. As soon as the last word is interrogated, the return to the routine of FIG. 4 is commanded, where operation 47 causes a comparison between CR and INZ/2. If CR is greater than INZ/2, then operation 45 increments the shift parameter one bit and calls the Count Subroutine repeatedly (FIG. 5) until CR becomes less than INZ/2. Operation 49 then sets $m$ = SP and returns to operation 33 of the FIG. 3 routine.

Although the invention is described hereinabove in the context of a pulse excitation spectrometer, it is not so limited since it would be usefully employed in any analytical instrument employing ensemble averaging processes including scanning and stocastic excitation techniques. Additionally, it is not a necessary part of this invention that the noise measuring state be the quiescent state where $E_{signal}$ equals zero. The experiment could be run such that the spectrometer exhibit a noise plus signal during the noise measuring state. The essential element is that the measurement of the noise level is possible.

Figure 8:
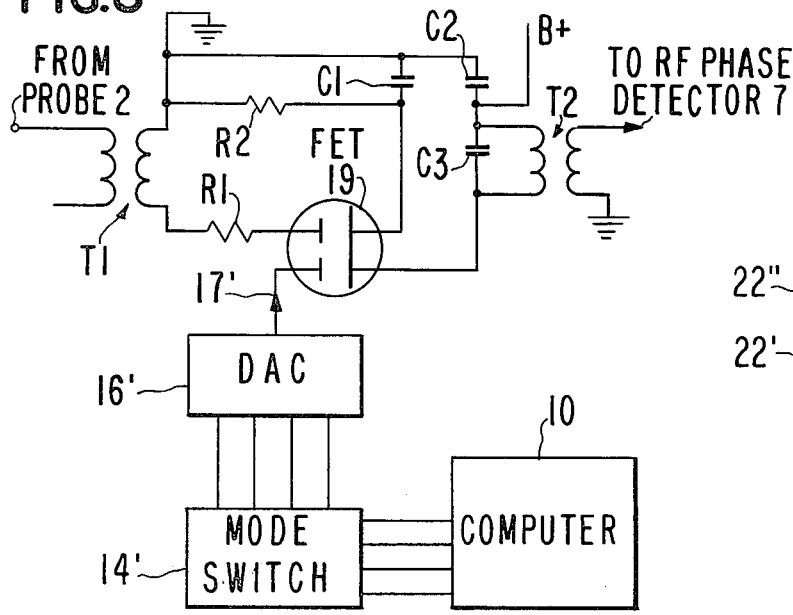
FIG. 8 is a gain controlled amplifier of FIG. 1.

FIG. 8 is a more detailed embodiment of that portion of FIG. 1 within dashed line section marks 8 — 8. A standard digital to analogue converter (DAC) 16' is connected to the computer 10 by the variable gain mode switch 14'. The computer 10, after determining the ratio V'/d, sends a digital word via variable gain mode switch 14' to the DAC 16' which converts the digital word to an analogue voltage which is sent along wire 17' to the FET 19 in RF amplifier 6 to control the gain of the amplifier. Circuit 21 is a portion of a typical amplifier circuit of RF amplifier 6 employed in the Varian model XL100 NMR spectrometer. The DAC output causes the gain of the RF amplifier 6 to be adjusted so that the V' is comparable to one digitizing bit of the A/D converter 9.

Figure 6:
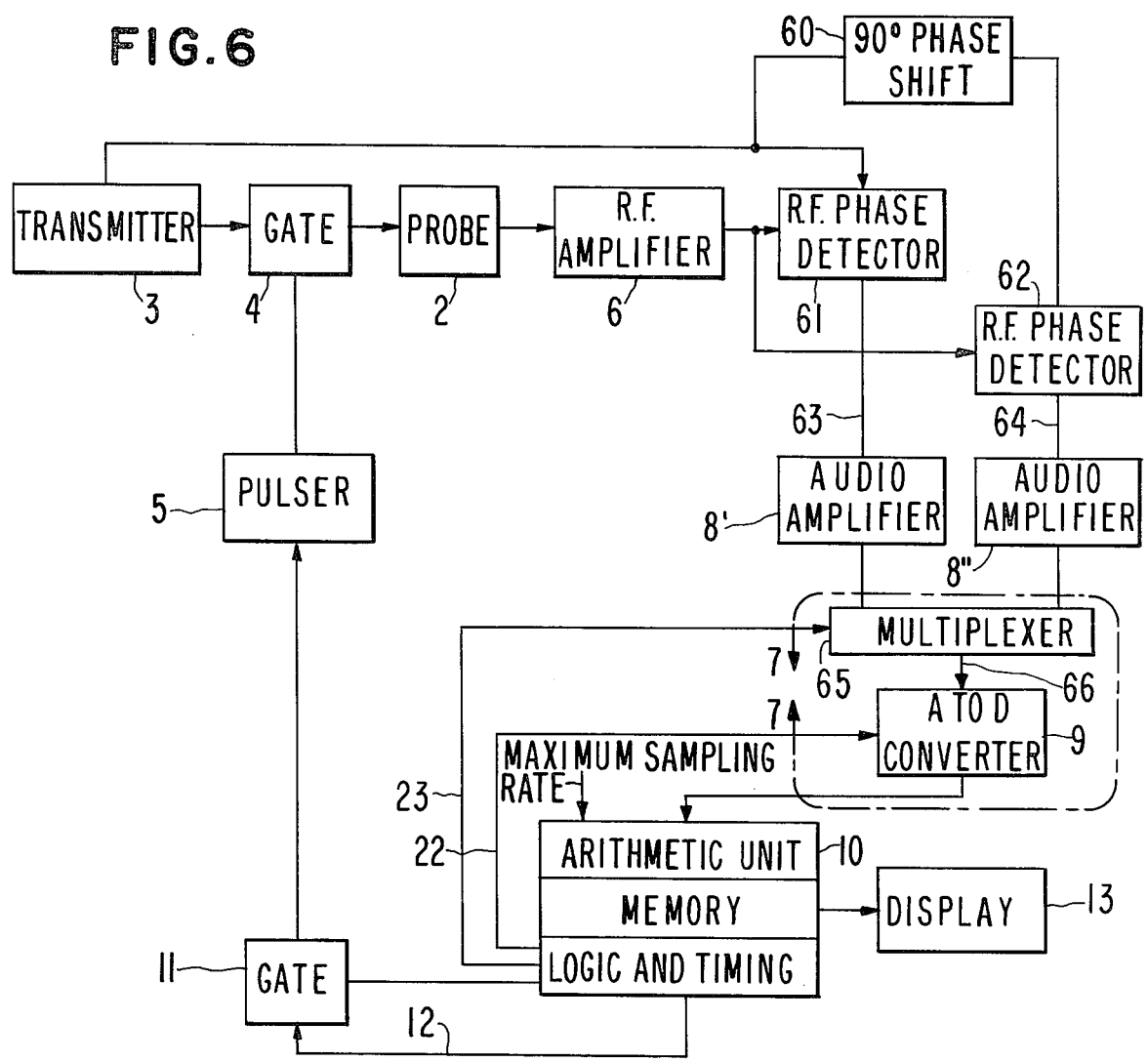
FIG. 6 is a block diagram of an alternate embodiment of the invention in conjunction with an quadrature detection FT NMR spectrometer.

With reference to FIG. 6, we disclose an alternate embodiment of our invention particularly for control of an NMR Fourier Transform spectrometer employing quadrature detection. The operation of an impulse FT spectrometer employing quadrature detection is more fully described in U.S. Pat. No. 3,501,695 filed May 8, 1968. Such a spectrometer enables improved signal-to-noise ratio by combining the results of separate Fourier analysis on both phase detector outputs. As in the scaling mode of FIG. 1, the computer issues quiescent command 12 to gate 11 which inhibits the operation of pulser 5. Next, computer 10 causes the multiplexer 65 to alternately switch the outputs of audio amplifier 8' and 8" to the input of A/D converter 9. The A/D converter 9 samples the noise from one channel, digitizes its value, and stores the digitized value in a table in storage for that channel, then repeats these steps for a sample of noise from the other channel. After an appropriate number of noise samples are stored, the routine of FIG. 4 and FIG. 5 are run independently on the data in each table to determine the $m$ parameter for each channel. A maximum permissible scaling factor, $n$, is then determined $n = m + 1$ where $m$ is the smaller of the two values of $m$. Alternatively, $n$ may be some function of the plural values of $m$. After $n$ is determined, the quiescent state command on wire 12 is removed and the probe 2 is excited by pulsed RF and the resonance signals are received and amplified by RF amplifier 6 and phase detected in detectors 61 and 62. Quadrature detection employs two phase detectors connected to RF amplifier 6, where each phase detector has its reference phase shifted by 90° from the other. The outputs of each of the two phase detectors 61 and 62 establish two separate channels of information which are separately amplified in audio amplifier 8' and 8" respectively and sampled and stored in separate tables in computer 10. As described previously with respect to FIG. 3, either progressive or non-progressive scaling is employed to control the scaling operation during ensemble averaging in the identical manner as described in FIG. 3. Hence, ensemble averaging is stopped, either when the desired number of traces has been stored or when further scaling will be inefficient, i.e., when $S > n$. At this point, the computer performs a Fourier transformation on the averaged time domain response data stored in the two independent tables and combines the results linearly to obtain the final frequency spectra of the sample which is sent to display 13.

Figure 7:
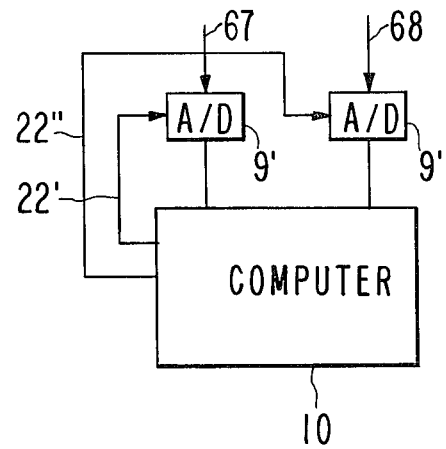
FIG. 7 is an alternate embodiment of a portion of FIG. 6.

With reference to FIG. 7, there is shown an alternate embodiment for the apparatus within the dashed section lines 7 — 7 on FIG. 6. The multiplexer 65 and A/D converter 9 can be replaced with two like A/D converters 9' which are synchronized by the computer 10 to alternately sample the audio amplifier outputs on lines 67 and 68. The invention provides an improved instrument for ensemble averaging a plurality of channels and examination of these channels with one or more A/D converter. Additionally, the noise level in each channel may be examined in parallel or serially as in FIG. 6 and automatic gain adjustments or scaling factor levels may be accomplished, all within the envisionment of this invention.

A suitable computer source program in Varian assembly language for use with a DAS assembler and a 620 series Varian Data Machines computer available from Varian Data Machines of Irvine California is as follows:

```
                    SADCACO
       000401    0001   WRMC   ,SET    ,0401
       000402    0002   SCL1   ,SET    ,0402
       000403    0003   SCL2   ,SET    ,0403
       000404    0004   RNDU   ,SET    ,0404
       000405    0005   CHEK   ,SET    ,0405
       000406    0006   SHFT   ,SET    ,0406
       000407    0007   SCAL   ,SET    ,0407
       000100    0008   AOTM   ,SET    ,0100
       000215    0009   DY     ,SET    ,0215
       000217    0010   ADCT   ,SET    ,0217
       001073    0011   MESS   ,SET    ,01073
       001023    0012   ERPR   ,SET    ,01023
       001041    0013   XDAD   ,SET    ,01041
       003006    0014   AAHK   ,SET    ,03006
       003342    0015   AOFI   ,SET    ,03342
       004510    0016   RWRD   ,SET    ,04510
       005000    0017   AQCA   ,SET    ,05000
       005256    0018   ASCA   ,SET    ,05266
       005371    0019   ACQS   ,SET    ,05371
       005124    0020   ACQT   ,SET    ,05124
       003653    0021   CORE   ,SET    ,03653
       003653    0022   TABL   ,EQU    ,CORE
       000020    0023   BICI   ,EQU    ,020
       000021    0024   BICF   ,EQU    ,021
       000060    0025   VADC   ,EQU    ,060
       000060    0026   ADCO   ,EQU    ,VADC
       000160    0027   SADC   ,EQU    ,0160
       000260    0028   EESA   ,EQU    ,0260
       000360    0029   DESA   ,EQU    ,0360
       000061    0030   MUXC   ,EQU    ,061
       000161    0031   MUXR   ,EQU    ,0161
       000240    0032   PIME   ,EQU    ,0240
       000540    0033   PIMC   ,EQU    ,0540
004025           0034          ,ORG    ,04025   PATCH IN PVC1.
004025 001000    0035          ,JMP    ,PVPH
004026 004760 R
004760           0036          ,ORG    ,04760
004760 006010    0037   PVPH   ,LDAI   ,8192
004761 020000
004762 055005    0038          ,STA    ,5,1      INITIALIZE CHEK
004763 010246    0039          ,LDA    ,0246
004764 055006    0040          ,STA    ,6,1
004765 005001    0041          ,TZA    ,
004766 055007    0042          ,STA    ,7,1
004767 001000    0043          ,JMP    ,04030
004770 004030
003003           0044          ,ORG    ,03003    PATCH IN AQMON
003003 001000    0045          ,JMP    ,AQPT     TO SCALING PATCH
003004 004740 R
004740           0046          ,ORG    ,04740
004740 002000    0047   AQPT   ,CALL   ,RWRD
004741 004510
004742 070100    0048          ,STX    ,AQTM
004743 005344    0049          ,DXR    ,
004744 001040    0050          ,JXZ    ,AQBK     NOT ON RA
004745 003006
004745 030215    0051          ,LDX    ,DX
004747 005344    0052          ,DXR    ,
004750 001040    0053          ,JXZ    ,AQBK     NOT ON DOUBLE PRECISION
004751 003006
004752 002000    0054          ,CALL*  ,AQCA+2   TAKE TEST TRANSIENT
004753 105002
004754 001000    0055          ,JMP    ,AOBK
004755 003006
005002           0056          ,OHS    ,05002
005002 005350 R  0057          ,DATA   ,(TSTR)
005350           0058          ,ORG    ,05350    FOR ACQIS
005350 000000    0059   TSTR   ,ENTR   ,        TAKE TEST TRANSIENT
005351 100360    0060          ,EXC    ,DESA     RESET ADC
005352 100021    0061          ,EXC    ,BICF     RESET BIC
005353 100540    0062          ,EXC    ,PIMC     RESET PIN
005354 005000    0063          ,NOP    ,
005355 100161    0064          ,EXC    ,MUXR     SETUP MUX
005356 005101    0065          ,INCR   ,01
005357 103161    0066          ,OAR    ,MUXC
005360 102560    0067          ,CIA    ,VADC     SETUP ADC
005361 103060    0068          ,OME    ,VADC,ADCT
005362 000217
005363 005000    0069          ,NOP    ,
005364 005000    0070          ,NOP    ,
005365 100160    0071          ,EXC    ,SADC     SET ADC GOING
005366 100260    0072          ,EXC    ,EESA
```

-continued

| | | | | | | |
|---|---|---|---|---|---|---|
| 005367 | 013653 | | 0073 | | ,LDA | ,CORE |
| 005370 | 103120 | | 0074 | | ,OAR | BICI |
| 005371 | 006120 | | 0075 | | ADDI | ,0177 |
| 005372 | 000177 | | | | | |
| 005373 | 103121 | | 0076 | | ,OAR | ,BICF | SET BIC ADDRESSES |
| 005374 | 100020 | | 0077 | | ,EXC | ,BICI | SET BIC/ADC GOING |
| 005375 | 100060 | | 0078 | | ,EXC | ,ADCO | |
| 005376 | 101021 | | 0079 | LLLL | ,SEN | ,BICF,BCBD | |
| 005377 | 005427 | R | | | | | |
| 005400 | 101020 | | 0080 | | ,SEN | ,BICI,LLLM | |
| 005401 | 005404 | R | | | | | |
| 005402 | 001000 | | 0081 | | ,JMP | ,LLLL | WAIT FOR BIC COMPLETE |
| 005403 | 005376 | R | | | | | |
| 005404 | 002000 | | 0082 | LLLM | ,CALL | ,TRAV | |
| 005405 | 005461 | R | | | | | |
| 005406 | 005001 | | 0083 | | ,TZA | , | TEST TRANSIENT |
| 005407 | 050406 | | 0084 | | ,STA | ,SHFT | |
| 005410 | 002000 | | 0085 | | ,CALL | ,COUNT | # OF POSITIVE VALUES |
| 005411 | 005432 | R | | | | | |
| 005412 | 004301 | | 0086 | | ,ASRA | ,01 | /2 |
| 005413 | 054111 | | 0087 | | ,STA | ,MAXP | |
| 005414 | 040406 | | 0088 | AGN | ,INR | ,SHFT | |
| 005415 | 010406 | | 0089 | | ,LDA | ,SHFT | # OF SHIFTS |
| 005416 | 002000 | | 0090 | | ,CALL | ,COUNT | # OF POSITIVE VALUES WITH SHFT |
| 005417 | 005432 | R | | | | | |
| 005420 | 144104 | | 0091 | | ,SUB | ,MAXP | MAXIMUM # OF POSITIVE VALUES/2 |
| 005421 | 001002 | | 0092 | | ,JAP | ,AGN | CAN SCALE MORE |
| 005422 | 005414 | R | | | | | |
| 005423 | 010406 | | 0093 | | ,LDA | ,SHFT | |
| 005424 | 050246 | | 0094 | | ,STA | ,0246 | INITIALIZE IT |
| 005425 | 001000 | | 0095 | | ,IMPX | ,TSTR | |
| 005426 | 105350 | R | | | | | |
| 005427 | 002000 | | 0096 | HCHD | ,CALL* | ,ERRR | |
| 005430 | 101023 | | | | | | |
| 005431 | 141311 | | 0097 | | ,04TA | ,'BI' | BIC HAD |
| 005432 | 000000 | | 0098 | COUNT | ,ENTR | , | # OF POSITIVE NON ZERO VALUES |
| 005433 | 124070 | | 0099 | | ,ADD | ,ASRA | |
| 005434 | 0S1000 | | 0100 | | , | ,SHF | |
| 005435 | 011001 | | 0101 | | ,TZA | , | |
| 005436 | 054067 | | 0102 | | , | ,CNT | SET COUNT TO ZERO |
| 005437 | 000553 | | 0103 | | ,LDX | ,TABL | |
| 005440 | 040052 | | 0104 | | ,LDZ | ,HAND | |
| 005441 | 015000 | | 0105 | TASH | ,LDA | ,0,1 | |
| 005442 | 005000 | | 0106 | SHF | ,NOP | , | |
| 005443 | 001004 | | 0107 | | ,JAW | ,NXT | |
| 005444 | 005450 | R | | | | | |
| 005445 | 001010 | | 0108 | | ,JAZ | ,NXT | |
| 005446 | 005450 | R | | | | | |
| 005447 | 044056 | | 0109 | | ,INR | ,CNT | INCREASE COUNT FOR POSITIVE NON ZERO VALUE |
| 005450 | 005322 | | 0110 | NXT | ,DBR | , | |
| 005451 | 005144 | | 0111 | | ,IXR | , | |
| 005452 | 001020 | | 0112 | | ,IBZ | ,FINC | |
| 005453 | 005456 | R | | | | | |
| 005454 | 001000 | | 0113 | | ,JMP | ,TAGN | GET NEXT POINT |
| 005455 | 005441 | R | | | | | |
| 005456 | 014047 | | 0114 | FINC | ,LDA | ,CNT | |
| 005457 | 001000 | | 0115 | | ,IMP* | ,COUNT | COUNT IS DONE |
| 005460 | 105432 | R | | | | | |
| 005461 | 000000 | | 0116 | TRAV | ,ENTR | , | REMOVE DC OFFSET |
| 005462 | 005001 | | 0117 | | ,TZA | , | |
| 005463 | 054043 | | 0118 | | ,STA | ,TSUM | |
| 005464 | 054043 | | 0119 | | ,STA | ,TSUM+1 | |
| 005465 | 033653 | | 0120 | | ,LDX | ,CORE | |
| 005466 | 015000 | | 0121 | AGNT | ,LDA | ,0,1 | |
| 005467 | 004517 | | 0122 | | ,LASR | ,15 | |
| 005470 | 002000 | | 0123 | | ,CALL* | ,XDAD,TSUM | |
| 005471 | 101041 | | | | | | |
| 005472 | 005527 | R | | | | | |
| 005473 | 054033 | | 0124 | | ,STA | ,TSUM | |
| 005474 | 064033 | | 0125 | | ,STB | ,TSUM+1 | STORE SUM |
| 005475 | 005145 | | 0126 | | ,INCR | ,045 | |
| 005476 | 143653 | | 0127 | | ,SUB | ,CORE | |
| 005477 | 144023 | | 0128 | | ,SUB | ,HUND | CHECK COMPLETION |
| 005500 | 001004 | | 0129 | | ,JAN | ,TDON | |
| 005501 | 005504 | R | | | | | |
| 005502 | 001000 | | 0130 | | ,JMP | ,AGNT | |
| 005503 | 005466 | R | | | | | |
| 005504 | 014022 | | 0131 | TDON | ,LDA | ,TSUM | |
| 005505 | 024022 | | 0132 | | ,LDR | ,TSUM+1 | GET SUM |
| 005506 | 004410 | | 0133 | | ,LASL | ,8 | DIV BY 128 |
| 005507 | 054021 | | 0134 | | ,STA | ,AVER | |
| 005510 | 033663 | | 0135 | | ,LDX | ,CORE | |
| 005511 | 024011 | | 0136 | | ,LDB | ,HUND | |
| 005512 | 015000 | | 0137 | AGNU | ,LDA | ,0,1 | |
| 005513 | 144015 | | 0138 | | ,SUB | ,AVER | |
| 005514 | 055000 | | 0139 | | ,STA | ,0,1 | |
| 005515 | 005144 | | 0140 | | ,IXR | , | |
| 005516 | 005322 | | 0141 | | ,DBR | , | |
| 005517 | 001020 | | 0142 | | ,JHZ* | ,TRAV | AVER SUBTRACTED FROM DATA |

-continued

```
005520  105461  R
005521  001000     0143            ,JMP    ,AGNU
005522  005512  R
005523  000200     0144  HUND      ,DATA   ,0200
005524  004300     0145  ASRA      ,DATA   ,04300
005525  000000     0146  MAXP      ,DATA   ,
005526  000000     0147  CNT       ,DATA   ,
005527  000000     0148  TSUM      ,DATA   ,0,0
005530  000000
005531  000000     0149  AVER      ,DATA   ,
005003             0150            ,ORG    ,05003
005003  000000     0151  NSCL      ,ENTR   ,
005004  010407     0152            ,LDA    ,SCAL     NEXT TRANSIENT
005005  001010     0153            ,JAZ*   ,NSCL     NO CHANGE IN SCALING
005006  105003  R
005007  001004     0154            ,JAN    ,SCL3     NEED TO CHANGE TRANSIENT
                                   SCALING
005010  005030  R
005011  010402     0155            ,LDA    ,SCL1     CURRENT SHIFT
005012  144511     0156            ,SUB    ,ASRA
005013  140406     0157            ,SUB    ,SHFT     MAXIMUM SHIFT
005014  005311     0158            ,DAR    ,         CAN SHIFT 1 MORE
005015  001002     0159            ,JAP    ,LOFB
005016  005051  R
005017  006010     0160            ,LDAI   ,04301
005020  004301
005021  050403     0161            ,STA    ,SCL2     SCALE EVERYTHING
005022  005301     0162            ,DECR   ,01
005023  050407     0163            ,STA    ,SCAL     RETURNS TO SCL3
005024  120401     0164            ,ADD    ,NRMC     ADJUST NORMALIZING COUNT
                         ER
005025  050401     0165            ,STA    ,NRMC
005026  001000     0166            ,JMP*   ,NSCL
005027  105003  R
005030  014473     0167  SCL3      ,LDA    ,ASRA
005031  050403     0168            ,STA    ,SCL2     RESET DATA SCALING
005032  010404     0169            ,LDA    ,RNDU     ROUND UP #
005033  001010     0170            ,JAZ    ,SET1     FIRST TIME
005034  005046  R
005035  004201     0171            ,ASLA   ,01
005036  050404     0172  BACK      ,STA    ,RNDU     NEW ROUND UP #
005037  040402     0173            ,INR    ,SCL1     SCALE TRANSIENT BY 2
005040  040407     0174            ,INR    ,SCAL     RESET TO ZERO
005041  010405     0175            ,LDA    ,CHEK
005042  004301     0176            ,ASRA   ,1        SCALE ADC VALUE
005043  050405     0177            ,STA    ,CHEK
005044  001000     0178            ,JMP*   ,NSCL
005045  105003  R
005046  005101     0179  SET1      ,INCR   ,01
005047  001000     0180            ,JMP    ,BACK
005050  005036  R
005051  002000     0181  LOFB      ,CALL*  ,NESS,MESA  MAX SCALING
005052  101073
005053  005056  R
005054  001000     0182            ,JMP    ,AMPI     COMPLETE ACQUITION STUFF
005055  003342
005056  120240     0183  MESA      ,DATA   ,'        MAXIMUM ALLOWABLE SCALING',0
005057  120315
005060  140730
005061  144715
005062  152715
005063  120301
005064  146314
005065  147727
005066  140702
005067  146305
005070  120323
005071  141701
005072  146311
005073  147307
005074  000000
005152             0184            ,ORG    ,05152    PATCH IN ACQIS
005152  007400     0185            ,RDF    ,
005153  001000     0186            ,JMP    ,REDY
005154  005204  R
005175             0187            ,ORG    ,05175
005175  120405     0188            ,ADD    ,CHEK     CHECK POSTIVIE #
005176  140405     0189            ,SUB    ,CHEK
005177  140405     0190            ,SUB    ,CHEK     CHECK NEG #
005200  005122     0191            ,IBR    ,
005201  005344     0192            ,DXR    ,
005202  001040     0193            ,JXZ    ,ACQD     TRANSIENT DONE
005203  005212  R
005204  101060     0194  REDY      ,SEN    ,VADC,05166
005205  005166
005206  005000     0195            ,NOP    ,
005207  005000     0196            ,NOP    ,
005210  001000     0197            ,JMP    ,REDY
005211  005204  R
005212  005000     0198  ACQD      ,NOP    ,
005213  001001     0199            ,JOF    ,ARND
005214  005217  R
005215  001000     0200            ,JMP    ,NOSC     NO SCALING NECESSARY
005216  005220  R
```

-continued

| | | | | | | |
|---|---|---|---|---|---|---|
| 005217 | 040407 | 0201 | ARND | ,INR | ,SCAL | SCALING NECESSARY |
| 005220 | 100360 | 0202 | NOSC | ,EXC | ,DESA | |
| 005221 | 100240 | 0203 | | ,EXC | ,PIME | |
| 005222 | 034033 | 0204 | | ,LDX | ,ASCA | |
| 005223 | 001000 | 0205 | | ,RETU* | ,ACQT | |
| 005224 | 105124 | | | | | |
| | 005225 | R 0206 | | ,END | | |

0065 SYMBOLS

| | | | | | | | | | |
|---|---|---|---|---|---|---|---|---|---|
| ACQD | 005212 | 0193 | 0198 | | | | | | |
| ACQS | 005371 | 0019 | | | | | | | |
| ACQT | 005124 | 0020 | 0205 | | | | | | |
| ADCO | 000060 | 0026 | 0078 | | | | | | |
| ADCT | 000217 | 0010 | 0068 | | | | | | |
| AGN | 005414 | 0088 | 0092 | 0105 | 0113 | 0121 | 0130 | 0137 | 0143 |
| AGNT | 005466 | 0121 | 0130 | | | | | | |
| AGNU | 005512 | 0137 | 0143 | | | | | | |
| AQBK | 003006 | 0014 | 0050 | 0053 | 0055 | | | | |
| AQCA | 005000 | 0017 | 0054 | | | | | | |
| AQFI | 003342 | 0015 | 0182 | | | | | | |
| AQPT | 004740 | 0045 | 0047 | | | | | | |
| AQTM | 000100 | 0008 | 0048 | | | | | | |
| ARND | 005217 | 0199 | 0201 | | | | | | |
| ASCA | 005256 | 0018 | 0204 | | | | | | |
| ASRA | 005524 | 0086 | 0099 | 0145 | 0156 | 0167 | 0176 | | |
| AVER | 005531 | 0134 | 0138 | 0142 | 0149 | | | | |
| BACK | 005036 | 0172 | 0180 | | | | | | |
| BCBD | 005427 | 0079 | 0096 | | | | | | |
| BICF | 000021 | 0024 | 0061 | 0076 | 0079 | | | | |
| BICI | 000020 | 0023 | 0074 | 0077 | 0080 | | | | |
| CHEK | 000405 | 0005 | 0038 | 0175 | 0177 | 0188 | 0189 | 0190 | |
| CNT | 005526 | 0102 | 0109 | 0114 | 0147 | | | | |
| CORE | 003653 | 0021 | 0022 | 0073 | 0120 | 0127 | 0135 | | |
| COUNT | 005432 | 0085 | 0090 | 0098 | 0102 | 0109 | 0115 | 0160 | |
| DESA | 000360 | 0029 | 0060 | 0202 | | | | | |
| DY | 000215 | 0009 | 0051 | 0186 | 0194 | 0197 | | | |
| EESA | 000260 | 0028 | 0072 | | | | | | |
| ERPR | 001023 | 0012 | 0096 | | | | | | |
| FINC | 005456 | 0112 | 0114 | | | | | | |
| HUND | 005523 | 0104 | 0128 | 0136 | 0144 | | | | |
| LLLL | 005376 | 0079 | 0081 | | | | | | |
| LLLM | 005404 | 0080 | 0082 | | | | | | |
| LOFB | 005051 | 0159 | 0181 | | | | | | |
| MAXP | 005525 | 0087 | 0091 | 0146 | | | | | |
| MESA | 005056 | 0181 | 0183 | | | | | | |
| MESS | 001073 | 0011 | 0181 | | | | | | |
| MUXC | 000061 | 0030 | 0066 | | | | | | |
| MUXR | 000161 | 0031 | 0064 | | | | | | |
| NOSC | 005220 | 0200 | 0202 | | | | | | |
| NRMC | 000401 | 0001 | 0164 | 0165 | | | | | |
| NSCL | 005003 | 0151 | 0153 | 0166 | 0178 | | | | |
| NXT | 005450 | 0107 | 0108 | 0110 | | | | | |
| PIMC | 000540 | 0033 | 0062 | | | | | | |
| PIME | 000240 | 0032 | 0203 | | | | | | |
| PVPH | 004760 | 0035 | 0037 | | | | | | |
| REDY | 005204 | 0186 | 0194 | 0197 | | | | | |
| RNDU | 000404 | 0004 | 0169 | 0172 | | | | | |
| RWRD | 004510 | 0016 | 0047 | | | | | | |
| SADC | 000160 | 0027 | 0071 | | | | | | |
| SCAL | 000407 | 0007 | 0045 | 0092 | 0152 | 0153 | 0154 | 0161 | 0163 | 0168 | 0173 |
| | | 0174 | 0176 | 0181 | 0183 | 0200 | 0201 | | |
| SCL1 | 000402 | 0002 | 0155 | 0173 | | | | | |
| SCL2 | 000403 | 0003 | 0161 | 0168 | | | | | |
| SCL3 | 005030 | 0154 | 0163 | 0167 | | | | | |
| SET1 | 005046 | 0170 | 0179 | | | | | | |
| SHF | 005442 | 0006 | 0084 | 0088 | 0089 | 0090 | 0093 | 0100 | 0106 | 0157 |
| SHFT | 000406 | 0006 | 0084 | 0088 | 0089 | 0090 | 0096 | 0157 | |
| TABL | 003653 | 0022 | 0103 | | | | | | |
| TAGN | 005441 | 0105 | 0113 | | | | | | |
| TDON | 005604 | 0129 | 0131 | | | | | | |
| TRAV | 005461 | 0082 | 0116 | 0142 | | | | | |
| TSTR | 005350 | 0057 | 0059 | 0095 | | | | | |
| TSUM | 005527 | 0118 | 0119 | 0123 | 0124 | 0125 | 0131 | 0132 | 0148 |
| VADC | 000060 | 0025 | 0026 | 0067 | 0068 | 0194 | | | |
| XDAD | 001041 | 0013 | 0123 | | | | | | |

What is claimed is:

1. Method for improving the signal-to-noise ratio of time averaged outputs derived from an analytical instrument, said time averaged outputs comprising the sum of a number of low level resonance outputs derived from a spectrometer which outputs, during an experiment, have both signal and noise portions comprising the steps of:

determining a maximum sampling rate corresponding to the bandwidth of the frequency spectrum to be examined;

examining the output of said spectrometer, said examining step including sampling said output noise from said spectrometer at a desired sampling rate not greater than said maximum sampling rate with an A/D converter for a plurality of points;

determining a parameter $m$ equal to a function of the ratio of the rms value of said plurality of points of said examined output noise to $d$, the value of the least significant bit of said A/D converter; and controlling said analytical instrument to maintain the said ratio greater than a predetermined value $N$ during time averaging of the outputs of said spectrometer.

2. The method of claim 1 wherein the step of controlling said analytical instrument includes the step of discontinuing acquisitions by said analytical instrument when said ratio is less than said predetermined value N.

3. The method of claim 1 wherein said predetermined value N = 0.37.

4. The method of claim 1 wherein the step of determining said parameter $m$ comprises
   a. storing in binary representation the said A/D converter output for each said sampled point in a channel in a portion of said memory;
   b. determining CR where CR is the number of channels in said portion of memory which have stored values greater than zero;
   c. shifting all data $m$ times in all channels in said portion of memory so as to divide each channel by 2 for each shift until the number of stored values greater than zero in said portion of memory is less than CR/2.

5. The method of claim 4 wherein the step of controlling said analytical instrument to maintain said ratio greater than a predetermined ratio N comprises stopping acquisitions when the number of scaling operations is greater than $m + 1$.

6. The method of claim 1 wherein said predetermined value N = 0.74.

7. An analytical instrument comprising a spectrometer, a ensemble averaging computer including means for accumulating data to improve the signal-to-noise ratio of ensemble averaged low level resonance outputs derived from said spectrometer, said ensemble averaging computer including an A/D converter having a least significant bit value of $d$, a memory unit including scaling capability and storage of the scaling factor, an arithmetic unit, a logic and timing unit, said analytical instrument further including
   means for causing said A/D converter to perform a plurality of time displaced noise measurements and analogue to digital conversions of said noise measurements of the output of said spectrometer at a sampling rate less than a predetermined maximum sampling rate;
   means to cause said memory unit to store each said digital time noise displaced measurement in a separate channel of said memory;
   means for causing said computer to operate upon said plurality of digital time displaced readings to determine a factor $m$, wherein $m$ is proportional to log $kV'/d$ and where $V'$ is the rms value of the said stored digital time displaced measurements, $d$ is said least significant bit of the said A/D converter, and $k$ is a constant;
   means for generating a parameter $n$, where $n$ equals a function of $m$;
   means for causing said arithmetic unit to compare, in non-quiescent state operation, the number of said scaling operations to the parameter $n$; and
   means for discontinuing operation of said analytical instrument when said scaling factor exceeds the parameter $n$.

8. The apparatus of claim 7 wherein $n = m + 1$.

9. The apparatus of claim 7 wherein $n = m$.

10. The apparatus of claim 7 wherein said means for causing said A/D converter to perform a plurality of time displaced noise measurements includes means for placing said spectrometer in a quiescent state.

11. An analytical instrument comprising a spectrometer, a ensemble averaging computer including means for accumulating data to improve the signal-to-noise ratio of ensemble averaged low level resonance outputs derived from said spectrometer, said ensemble averaging computer including an A/D converter having a least significant bit value of $d$, a memory unit including scaling capability and storage of the scaling factor, an arithmetic unit, a logic and timing unit, said analytical instrument further including;
   means for causing said A/D converter to perform a plurality of time displaced noise measurements and analog to digital conversions of said noise measurements of the output of said spectrometer at a sampling rate less than a predetermined maximum sampling rate;
   means to cause said memory unit to store each said digital time displaced noise measurement in a separate channel of said memory;
   means for discontinuing accumulations of said analytical instrument responsive to a function of the ratio between the noise voltage represented by said plurality of said time displaced measurements and the said A/D converter least significant bit value $d$.

12. The apparatus of claim 11 wherein said means for discontinuing accumulations includes means for comparing the scaling factor to a function of the ratio of the rms voltage of said plurality of said time displaced noise measurements to the least significant bit $d$.

13. The apparatus of claim 12 wherein said means for discontinuing accumulations includes means for determining a function $m$, where $m = \log kV'/d$ where $V'$ equals the rms value of said plurality of said time displaced noise measurements, $k$ equals a constant and $d$ equals the value of the least significant bit of the A/D converter.

14. The apparatus of claim 11 including a second A/D converter for sampling a second output of said spectrometer.

15. The apparatus of claim 11 including a multiplexer connected between a plurality of outputs of said spectrometer and said A/D converter.

16. An analytical instrument comprising a spectrometer, a ensemble averaging computer including means for accumulating data to improve the signal-to-noise ratio of ensemble averaged low level resonance outputs derived from said spectrometer, said ensemble averaging computer including an A/D converter having a lease significant bit value of $d$, a memory unit including scaling capability and storage of the scaling factor, an arithmetic unit, a logic and timing unit, said analytical instrument further including;
   means for causing said A/D converter to perform a plurality of time displaced noise measurements and analog to digital conversions of said noise measurements of the output of said spectrometer at a sampling rate less than a predetermined maximum sampling rate;
   means to cause said memory unit to store each said digital time displaced noise measurement in a separate channel of said memory;
   means for adjusting the amplitude of said low level resonance outputs of said analytical instrument responsive to a function of the ratio between the noise voltage represented by said plurality of said time displaced measurements and the said A/D converter least significant bit value $d$.

17. The apparatus of claim 16 wherein said means for adjusting the amplitude of said low level resonance outputs derived from said spectrometer includes an amplifier, and means for controlling the gain of said amplifier to adjust the level of the signal at the input to said A/D converter.

18. The apparatus of claim 17 wherein said means for controlling the gain of said amplifier includes a digital to analog converter for supplying an analog voltage to a control grid of said amplifier, said digital to analog converter being connected to said ensemble averaging computer.

* * * * *

Dedication

4,070,708.—*Stephen H. Smallcombe* and *Howard D. W. Hill*, Cupertino, Calif. ANALYTICAL INSTRUMENT OPTIMUM DATA ACQUISITION METHOD AND APPARATUS. Patent dated Jan. 24, 1978. Dedication filed July 14, 1983, by the assignee, *Varian Associates, Inc.*

Hereby dedicates to the Public all claims of said patent.
[*Official Gazette August 30, 1983.*]